(12) United States Patent
Wright et al.

(10) Patent No.: US 10,964,448 B1
(45) Date of Patent: Mar. 30, 2021

(54) HIGH DENSITY RIBBON CABLE

(71) Applicant: Amphenol Corporation, Wallingford, CT (US)

(72) Inventors: Matthew S. Wright, Madison, CT (US); Carl S. Booth, Storrs, CT (US); Russell Isch, Coventry, CT (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 16/211,204

(22) Filed: Dec. 5, 2018

Related U.S. Application Data

(60) Provisional application No. 62/595,555, filed on Dec. 6, 2017.

(51) Int. Cl.
| | | |
|---|---|---|
| *H01B 7/08* | (2006.01) | |
| *H05K 9/00* | (2006.01) | |
| *H01B 13/14* | (2006.01) | |
| *H01B 7/00* | (2006.01) | |
| *H01B 3/42* | (2006.01) | |
| *H01B 13/00* | (2006.01) | |
| *H01B 7/02* | (2006.01) | |

(52) U.S. Cl.
CPC .......... *H01B 7/0807* (2013.01); *H01B 3/421* (2013.01); *H01B 7/0009* (2013.01); *H01B 7/02* (2013.01); *H01B 7/0823* (2013.01); *H01B 13/0016* (2013.01); *H01B 13/14* (2013.01); *H05K 9/0098* (2013.01)

(58) Field of Classification Search
CPC .... H01B 7/0807; H01B 3/421; H01B 7/0009; H01B 7/02; H01B 7/0823; H01B 13/0016; H01B 13/14; H05K 9/0098
See application file for complete search history.

(56) References Cited

U.S. PATENT DOCUMENTS

| | | | |
|---|---|---|---|
| 3,576,723 A | | 4/1971 | Angele et al. |
| 3,790,697 A | * | 2/1974 | Buckingham ............ H01B 9/02 174/102 R |
| 3,833,755 A | * | 9/1974 | Soelberg .............. H01B 7/0838 174/117 F |
| 4,185,162 A | * | 1/1980 | Bogese, II ........... H01B 7/0838 174/115 |

(Continued)

FOREIGN PATENT DOCUMENTS

| | | |
|---|---|---|
| JP | H3-145012 | 6/1991 |
| WO | WO 2010/148165 A2 | 12/2010 |

(Continued)

*Primary Examiner* — Timothy J Thompson
*Assistant Examiner* — Rhadames Alonzo Miller
(74) *Attorney, Agent, or Firm* — Wolf, Greenfield & Sacks, P.C.

(57) ABSTRACT

A ribbon cable with desirable properties including mechanical integrity, resistance to propagation of a flame, and a compact structure is provided. The ribbon cable may be formed by wrapping a flexible layer around a plurality of parallel cable cores. The flexible layer may be adhered to itself and may conform to the outer surfaces of the cores. The flexible layer may, at its edges, overlap such that the edges may be readily adhered to each other. Some or all of the cable cores may be individually shielded. The cable may also include metal foil adjacent one or two sides of the cable cores or, in some instances, encircling the cable cores.

20 Claims, 5 Drawing Sheets

(56) References Cited

U.S. PATENT DOCUMENTS

| | | | | |
|---|---|---|---|---|
| 4,281,211 A * | 7/1981 | Tatum | ............ | H01B 7/083 |
| | | | | 174/117 F |
| 4,475,006 A * | 10/1984 | Olyphant, Jr. | ....... | H01B 7/0861 |
| | | | | 174/102 R |
| 4,481,379 A * | 11/1984 | Bolick, Jr. | ............ | H01B 7/0838 |
| | | | | 174/117 F |
| 4,487,992 A * | 12/1984 | Tomita | ................ | H01B 11/203 |
| | | | | 174/115 |
| 4,490,574 A * | 12/1984 | Tomita et al. | ........ | H01B 7/0861 |
| | | | | 174/115 |
| 4,572,922 A * | 2/1986 | Plummer, III | ........... | H01B 7/08 |
| | | | | 174/36 |
| 4,596,897 A * | 6/1986 | Gruhn | ............... | H01B 11/1091 |
| | | | | 174/36 |
| 4,734,542 A * | 3/1988 | Klein | ................... | H02G 3/0487 |
| | | | | 174/36 |
| 4,737,598 A * | 4/1988 | O'Connor | ................ | B32B 15/08 |
| | | | | 174/36 |
| 5,025,115 A * | 6/1991 | Sayegh | ................. | H01B 7/0823 |
| | | | | 174/117 F |
| 5,030,794 A * | 7/1991 | Schell | ................... | H01B 7/0861 |
| | | | | 174/36 |
| 5,053,583 A * | 10/1991 | Miller | ..................... | H01B 11/20 |
| | | | | 174/36 |
| 5,073,683 A | 12/1991 | Anderson et al. | | |
| 5,162,611 A * | 11/1992 | Nichols, III | ......... | H01B 7/0823 |
| | | | | 174/115 |
| 5,180,885 A * | 1/1993 | Shah | ................. | H01B 11/1016 |
| | | | | 156/54 |
| 5,235,132 A * | 8/1993 | Ainsworth | ........... | H01B 7/0861 |
| | | | | 156/55 |
| 5,262,589 A * | 11/1993 | Kesler | ................. | H01B 7/0861 |
| | | | | 156/53 |
| 5,268,531 A * | 12/1993 | Nguyen | ............... | H01B 7/0861 |
| | | | | 156/55 |
| 5,286,924 A * | 2/1994 | Loder | ................... | H01B 7/0838 |
| | | | | 156/52 |
| 5,367,123 A * | 11/1994 | Plummer, III | ..... | H01B 11/1016 |
| | | | | 174/1 |
| 5,387,113 A * | 2/1995 | Dickerson | ............. | H01R 12/62 |
| | | | | 439/98 |
| 5,502,287 A * | 3/1996 | Nguyen | ............... | H01B 7/0838 |
| | | | | 156/53 |
| 5,767,442 A * | 6/1998 | Eisenberg | ............ | H01B 7/0892 |
| | | | | 174/113 R |
| 5,900,587 A * | 5/1999 | Piper | ..................... | H01R 12/62 |
| | | | | 174/117 F |
| 5,956,445 A * | 9/1999 | Deitz, Sr. | ............... | G02B 6/441 |
| | | | | 174/24 |
| 5,980,303 A * | 11/1999 | Lee | ..................... | H01R 12/675 |
| | | | | 439/405 |
| 6,384,326 B1 * | 5/2002 | McFadden | ......... | H01B 11/1008 |
| | | | | 174/36 |
| 6,831,230 B2 * | 12/2004 | Ide | ....................... | H01B 7/0861 |
| | | | | 174/84 R |
| 7,790,981 B2 | 9/2010 | Vaupotic et al. | | |
| 9,350,571 B2 * | 5/2016 | Watanabe | ............ | H04L 25/0272 |
| 9,362,023 B2 * | 6/2016 | Gundel | ................ | H01B 7/0861 |
| 2002/0020545 A1* | 2/2002 | Suzuki | ................. | H01B 7/0861 |
| | | | | 174/117 F |
| 2003/0085052 A1* | 5/2003 | Tsao | ..................... | H01B 7/0861 |
| | | | | 174/113 R |
| 2003/0213610 A1* | 11/2003 | Ide | ....................... | H01B 7/0861 |
| | | | | 174/117 F |
| 2004/0011552 A1* | 1/2004 | McKenney | .......... | H01B 7/0018 |
| | | | | 174/117 F |
| 2010/0186225 A1* | 7/2010 | Reichert | ............. | H01B 7/0838 |
| | | | | 29/825 |
| 2013/0105196 A1* | 5/2013 | Gundel | ................ | H01B 7/0807 |
| | | | | 174/110 SR |
| 2013/0146327 A1* | 6/2013 | Gundel | ................ | H01B 7/0861 |
| | | | | 174/103 |
| 2013/0168149 A1* | 7/2013 | Gundel | ................ | H01B 7/0861 |
| | | | | 174/350 |
| 2014/0000931 A1* | 1/2014 | Gundel | ................ | H01B 7/0861 |
| | | | | 174/105 R |
| 2014/0014406 A1* | 1/2014 | Gundel | ................ | H01B 7/0861 |
| | | | | 174/350 |
| 2014/0017493 A1* | 1/2014 | Gundel | ................ | H01B 7/0233 |
| | | | | 428/376 |
| 2014/0027150 A1* | 1/2014 | Gundel | ................ | H01B 7/0838 |
| | | | | 174/102 R |
| 2014/0345903 A1* | 11/2014 | Gundel | ................ | H01B 7/0807 |
| | | | | 174/107 |
| 2016/0078983 A1* | 3/2016 | Gundel | ................ | H01B 7/0869 |
| | | | | 174/102 R |

FOREIGN PATENT DOCUMENTS

| | | |
|---|---|---|
| WO | WO 2012/030362 A1 | 3/2012 |
| WO | WO 2012/030364 A1 | 3/2012 |
| WO | WO 2012/030365 A1 | 3/2012 |
| WO | WO 2012/030366 A1 | 3/2012 |
| WO | WO 2012/030367 A1 | 3/2012 |
| WO | WO 2012/138729 A1 | 10/2012 |
| WO | WO 2013/066407 A1 | 5/2013 |
| WO | WO 2014/074269 A1 | 5/2014 |
| WO | WO 2014/179106 A2 | 11/2014 |

\* cited by examiner

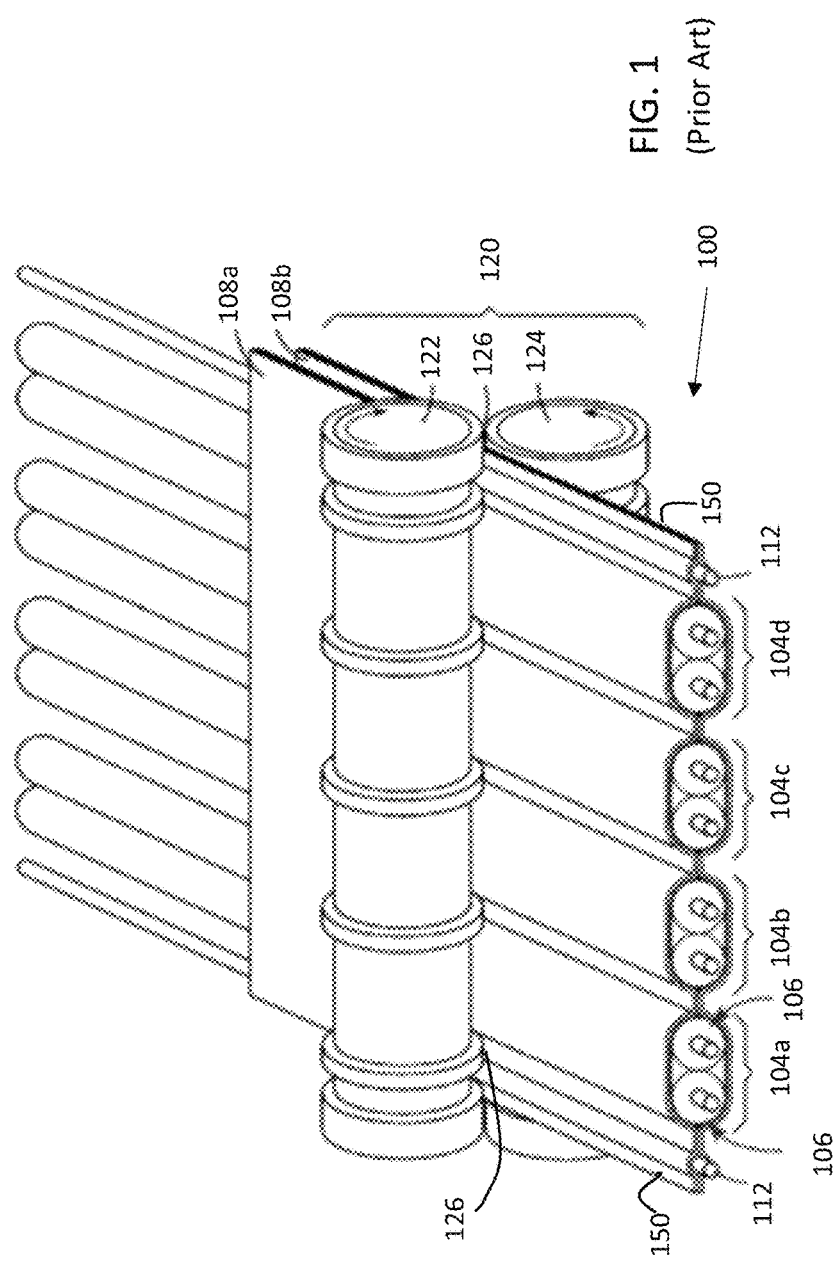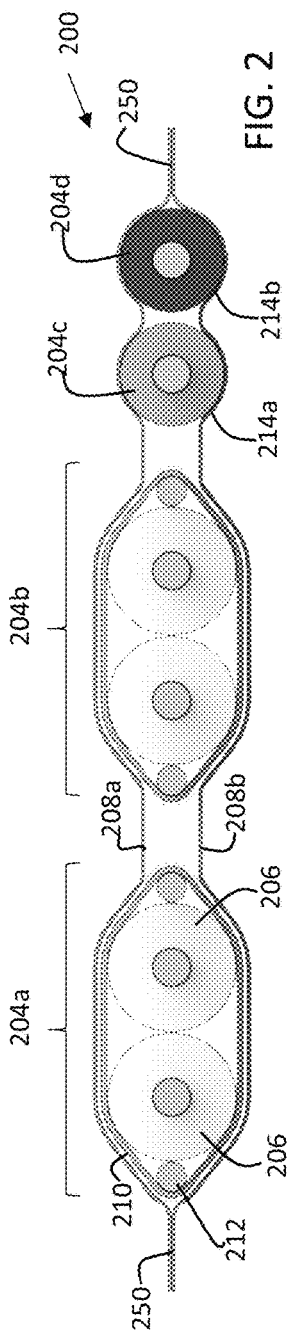
FIG. 1 (Prior Art)
FIG. 2

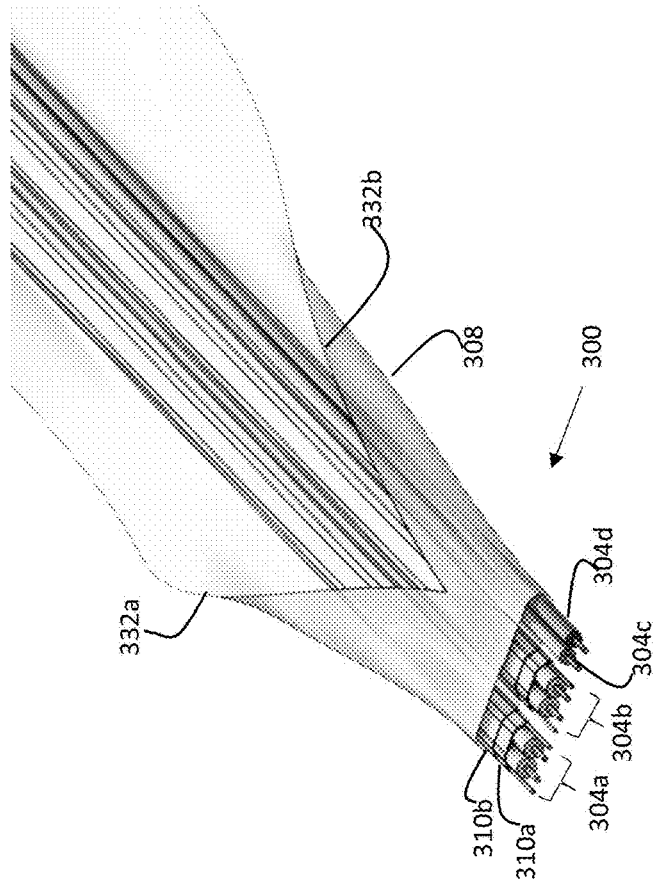
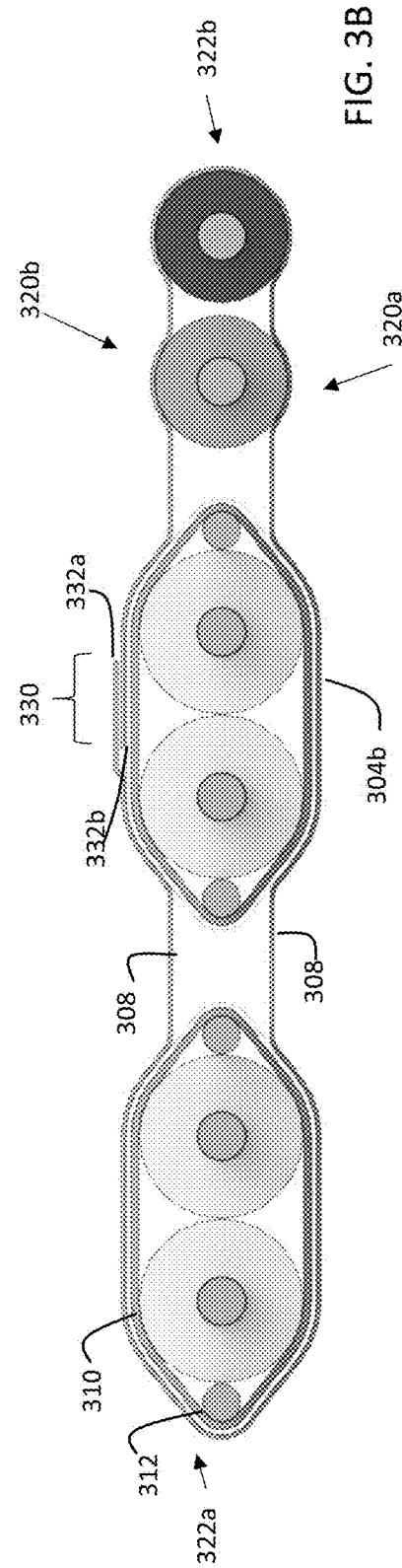

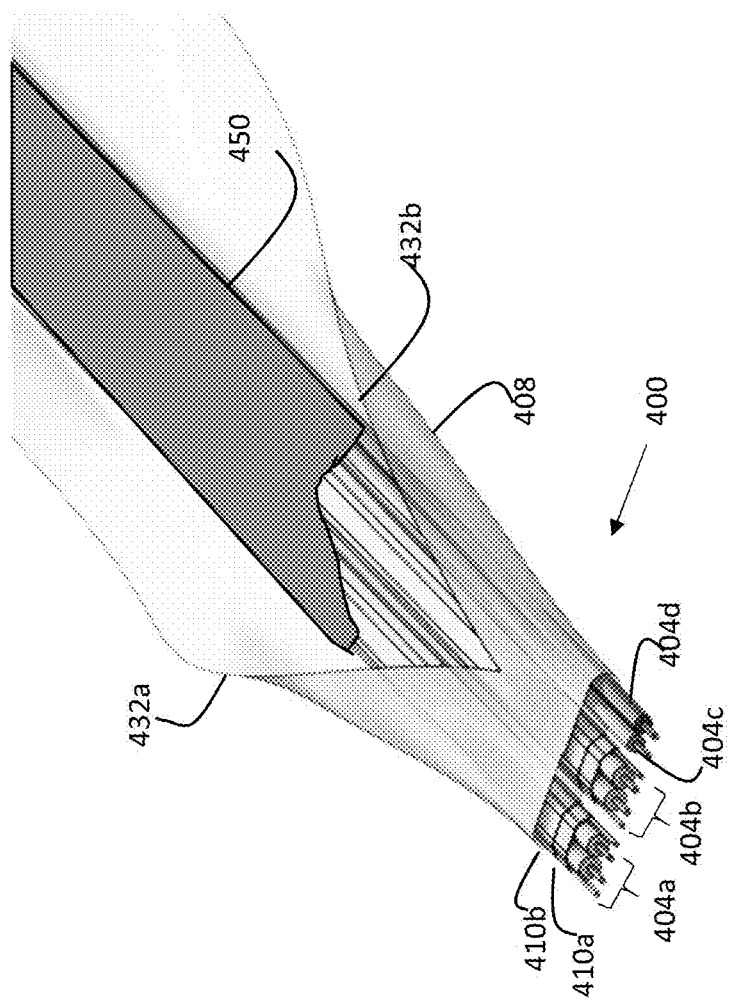

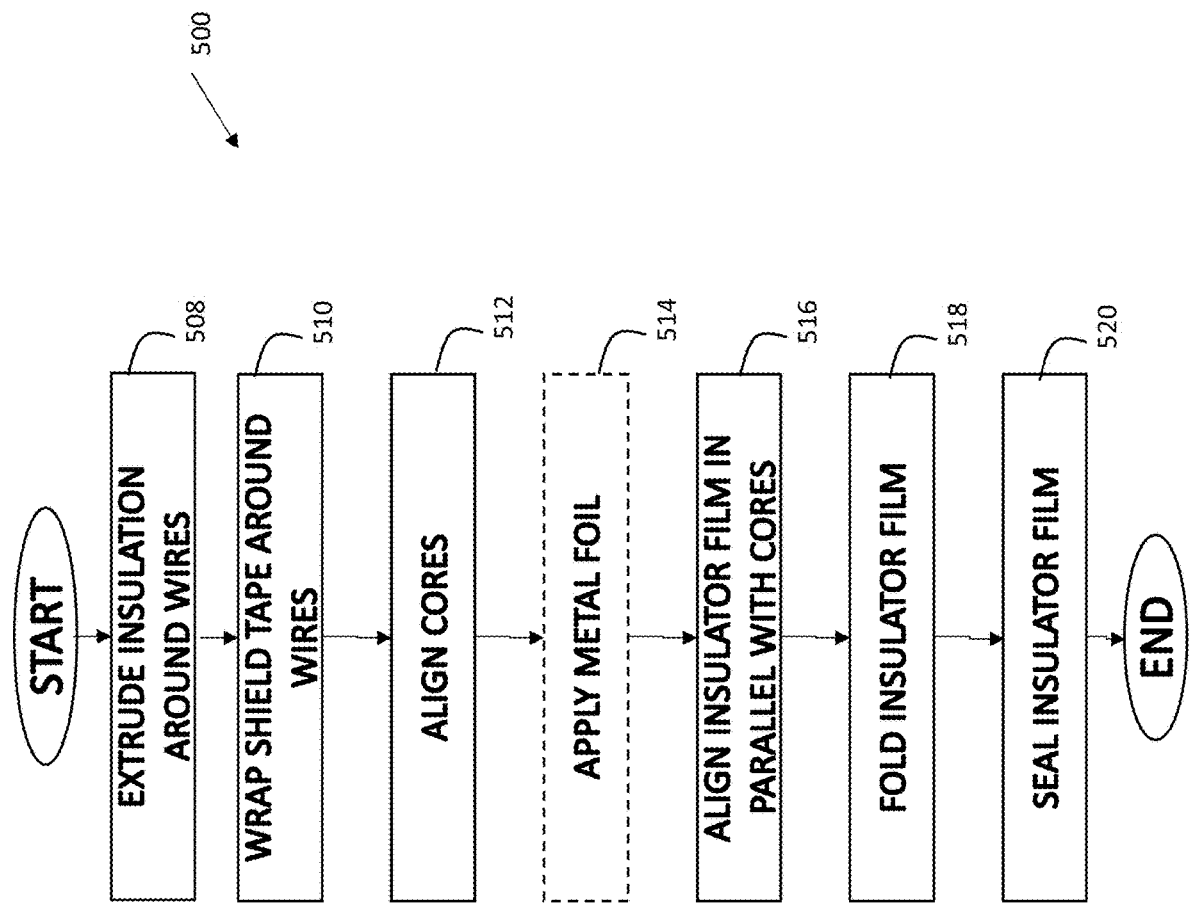

HIGH DENSITY RIBBON CABLE

CROSS-REFERENCE TO RELATED APPLICATIONS

This application claims priority to and the benefit of U.S. Provisional Application Ser. No. 62/595,555, filed. Dec. 6, 2017, entitled "HIGH DENSITY RIBBON CABLE." The entire contents of this application is incorporated herein by reference in their entirety.

BACKGROUND

This patent application relates generally to electrical cables used to transmit signals inside of electronic devices, such as servers and routers.

As electronics packaging densities and data rates increase, traditional PC board materials carrying signals from one internal system device to another such as solid state drives and drive controllers have been demonstrated to have too much electrical loss to successfully carry high frequency signals with acceptable signal integrity. As an alternative to PC boards, known cable designs have been demonstrated to successfully carry these signals much longer distance at lower loss.

A cable provides signal paths with high signal integrity, particularly for high frequency signals, such as those above 25 Gbps using an NRZ protocol. Each cable has one or more signal conductors, which is surrounded by a dielectric material, which in turn is surrounded by a conductive layer. A protective jacket, often made of plastic, may surround these components.

The signal conductor, dielectric and conductive layer are flexible, giving rise to a desirable property of cables. The flexibility enables uniform cable properties to be maintained even if the cable is folded with many bends, promoting signal transmission with high integrity.

One type of cable, referred to as a "twinax cable," is constructed to support transmission of a differential signal and has a balanced pair of signal wires, which are embedded in a dielectric, and encircled by a conductive layer. In addition to uniform dimensions of the signal wires over the length of the cable, the spacing of the wires relative to each other and to the conductive layer is maintained over the length of the cable because those components are positioned by the dielectric. Such a cable may be formed by extruding the dielectric around the signal wires and then holding the signal wires and the conductive layer in an integrated structure.

The conductive layer is usually formed using foil, such as aluminized polyester, or wire braid wrapped around the surface of the dielectric. Characteristic impedance in the cable is influenced by, among other things, the conductive layer, which also provides shielding that reduces crosstalk between signal conductors in twinax cables that may be routed together as a cable bundle and forms the cable ground reference.

A twinax cable can also have a drain wire. Unlike a signal wire, which is generally coated with a dielectric to prevent electrical contact with other conductors in the cable, the drain wire may be uncoated so that it contacts the conductive layer at multiple points over the length of the cable. At an end of the cable, where the cable is to be terminated to a connector or other terminating structure, the protective jacket, dielectric and the foil may be removed, leaving portions of the signal wires and the drain wire exposed at the end of the cable. These wires may be attached to a terminating structure, such as a connector. The signal wires may be attached to conductive elements serving as mating contacts in the connector structure. The drain wire may be attached to a ground conductor in the terminating structure. In this way, any ground return path may be continued from the cable to the terminating structure.

In many electronic systems, multiple electrical signals must be routed between various subsystem components within a system enclosure, such as solid state disk drives and storage controllers in a server. In such scenarios, multiple cable strands, each designed for carrying one signal, are held in a group that can be handled together as a single cable. The individual cable strands are sometimes called cable "cores." For cables that connect boxes, a common form factor is a round cable bundle, containing multiple twinax or other cable cores extruded with an insulative jacket. For use inside a box, ribbon cables are common. In a ribbon cable, multiple cable cores are held together in parallel by a polymer web.

Frequently, the cable jacket of a round cable is made of PVC or other flame resistant material, so that if a fire occurs in one box it will not spread over a cable to another box. For cables intended for use inside a box, the web holding the cable cores may be polyester, because flame spread tests are less severe for cables intended to be contained within an electronics box designed to prevent the spread of fire.

SUMMARY

According to one aspect of the present application, a ribbon cable is provided. The ribbon cable comprises a plurality of cores, wherein each core comprises at least one conductor and shielding material, and the plurality of cores are aligned in parallel, so as to define a first side and a second side and a first edge and a second edge. The ribbon cable also comprises a wrap comprising an insulative layer encircling the plurality of cores, wherein the wrap conforms to outer surfaces of the plurality of cores at the first side and at the first edge and the second edge and at at least a portion of the second side.

In some embodiments, the wrap comprises a polyester film. The polyester film has a thickness between 5 microns and 20 microns.

In some embodiments, the ribbon cable further comprises an adhesive layer applied to the polyester film. The adhesive layer has a thickness between 10 microns and 25 microns.

In some embodiments, the wrap comprises a metal layer and further comprises a polyester film. The ribbon cable may further comprise a plurality of shields, each of the plurality of shields being wrapped around the at least one conductor of a core of the plurality of cores. The metal layer is electrically insulated within the cable from the plurality of shields. In some embodiments, each of the plurality of shields comprises a laminate comprising an insulating film and a metal foil bonded thereto. In further embodiments, for each of the plurality of shields, the laminate is longitudinally wrapped around the at least one conductor of a respective core of the plurality of cable cores.

According to another aspect of the present application, a method of manufacturing a ribbon cable is provided. The method comprises aligning a plurality of shielded cable cores in parallel so as to define a first side and a second side, positioning a flexible sheet adjacent the first side, folding a first edge and a second edge of the flexible sheet over the plurality of cable cores such that the first edge and the second edge are adjacent the second side, and adhering the flexible sheet to outer surfaces of the plurality of cable cores.

In some embodiments, adhering the overlapping portions of the first edge and second edge further comprises adhering the flexible sheet to surfaces of the plurality of cable cores. In further embodiments, the adhering comprises heat sealing.

In some embodiments, the plurality of cable cores comprises twinax cable cores and single conductor cores and/or coax cable cores.

In some embodiments, the method further comprises prior to the folding the first edge and the second edge, positioning a layer of metal adjacent the second side.

The foregoing is a non-limiting summary of the invention.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1 is an isometric view of a cable made according to a conventional process;

FIG. 2 is a cross section of a cable made according to an alternative conventional process;

FIG. 3A is an exemplary embodiment of the cable made according to the disclosure herein;

FIG. 3B is a cross sectional view of the exemplary cable of FIG. 3A;

FIG. 4 is an isometric view of an alternative embodiment of an exemplary cable made according to the disclosure herein;

FIG. 5 is a flowchart of an exemplary process for making a cable according to the disclosure herein.

DETAILED DESCRIPTION

Figure 6:
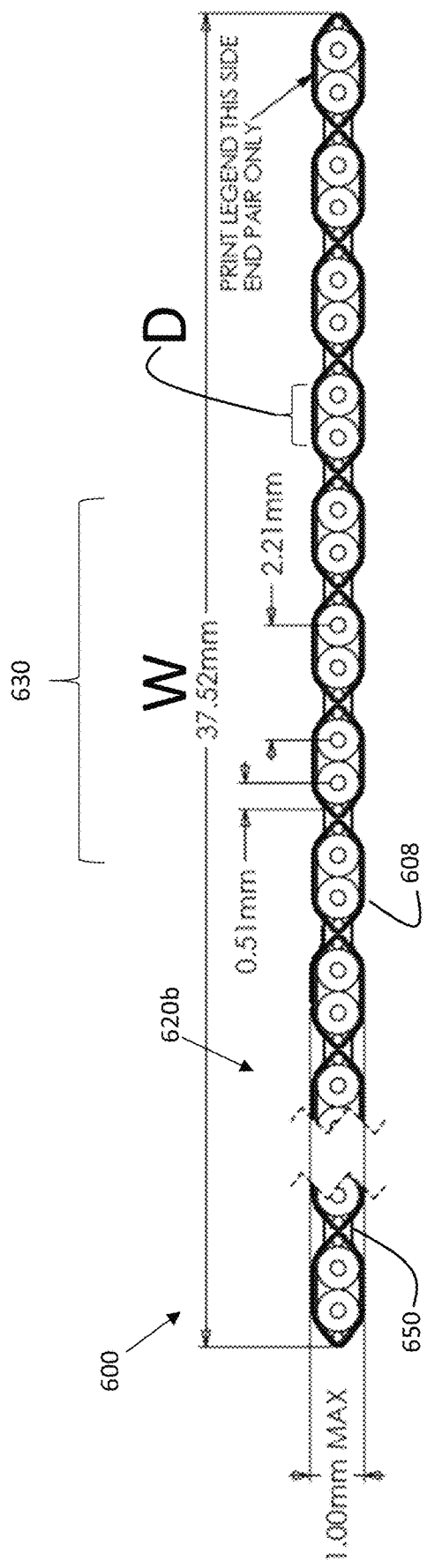
FIG. 6 is a cross section of a further alternative embodiment of an exemplary cable.

The inventors have recognized and appreciated techniques to manufacture ribbon cables that result in more compact cables that resist delamination and are more likely to meet flame spread tests than conventional designs. In accordance with some embodiments, a ribbon cable may be made by wrapping a sheet containing insulative material around a plurality of cable cores. The sheet may encircle the cable cores such that one edge of the sheet overlaps the other edge of the sheet. The sheet may conform to outer surfaces of the cable cores along upper and lower surfaces of the cable and at side edges of the cable.

The sheet may be adhered to the cable cores where the sheet conforms to the cable cores. The sheet alternatively or additionally may adhere to itself in region where one edge of the sheet overlaps the other edge. Adhesion may be provided as a result of an adhesive layer applied to one or both of the surfaces to be adhered.

The sheet may be or comprise an insulative film. In some embodiments, the insulative film may be a polyester film. In other embodiments, the insulative film may be a polyimide film, but any suitable material may be used. In yet other embodiments, the sheet may comprise multiple layers, such that two or more insulative films may encircle the cable cores, such as with a polyester film closer to the cores and polyimide film defining or being closer to the outer surface of the ribbon cable.

In some embodiments, the sheet may comprise a metal foil, such as an aluminum or copper foil, as one or more of the layers in the sheet. In accordance with some embodiments, the cable cores may be individually shielded and the metal foil may provide bend "memory" for the cable without providing an electrical function. For example, the foil may yield when the cable is folded, but thereafter retain its shape to aid in holding the cable in the fold.

Moreover, it should be appreciated that, in an embodiment in which multiple layers encircle the cable cores, the layers may be adhered to each other prior to encircling the cable cores or may be applied successively to the cable cores and then adhered to each other.

The cable cores may be, for example, twinax cable cores. Alternatively or additionally, the cable cores may be coaxial, triaxial or may have any suitable number of conductors. Moreover, one or more of the cable cores may comprise single insulated wires. In some embodiments, one or more cable cores may be bare wires.

FIG. 1 illustrates a conventional approach to manufacturing ribbon cables. Cable cores 104a, 104b, 104c and 104d each have a twinax configuration, with two insulated conductors 106. The cable also includes drain wires 112. The insulative material surrounding the conductors sets the spacing between the conductors. Both the insulated conductors and drain wires 112 are sandwiched between flexible sheets 108a, 108b, which have a layer of metal foil backed by a layer of polyester laminate.

The sandwich is then passed into a forming tool 120 with pinch rollers 122 and 124. Pinch rollers 122 and 124 are shaped to create regions 126 that pinch the flexible sheets 108a and 108b together on each side of the cable and between all of the cable cores. Pinch rollers 122 and 124 apply pressure and heat to adhere the layers 108a and 108b to each other where pinched, and may also apply pressure to the flexible sheets 108a and 108b above the cable cores. The foil in flexible sheets 108a and 108b holds the cable cores together, and also acts as a shield around the cable cores.

FIG. 2 illustrates in cross section of an alternative cable configuration in which cable cores 204a, 204b, 204c and 204d are also held in a ribbon cable 200 by flexible sheets, using a known manufacturing technique. In the embodiment illustrated in FIG. 2, the cable cores have different configurations. Cable cores 204a and 204b have a twinax configuration. In contrast, cable cores 204c and 204d are single insulated conductors 214a and 214b, respectively. Such a configuration enables a cable that can carry both high-speed differential signals in cores 204a and 204b and lower speed control or power in cable cores 204c and 204d.

Each of the twinax cores 204a and 204b may be formed prior to forming the ribbon cable 200. Each core, for example, may be formed by positioning a pair of insulated conductors 206 adjacent to one another and positioning drains 212 beside each insulated conductor. However, any suitable number of drain wires may be used, and embodiments may be constructed in which, for example, there is only one drain wire per pair.

Those conductors may then be wrapped with a shielding composite material 210 that has a layer of metal foil, frequently supported by a polymer layer that provides mechanical integrity. The shielding composite material may be spirally wrapped around the conductors or may be longitudinally wrapped, either of which may be performed using techniques as are known in the art.

The cores 204a, 204b, 204c and 204d may then be aligned in parallel and placed between sheets 208a and 208b. Those sheets, for example, may be a polymer, such as polyester. Sheets 208a and 208b may be adhered to outer surfaces of the cores and to each other in the margins of the cable, forming wings 250. Those sheets may be adhered to each other and to the cable cores using adhesive, such as EAA, which may be coated on either or both of the parts to be adhered. Similar wings 150 are formed in the margins of cable 100 (FIG. 1).

The inventors have recognized and appreciated that forming a cable without wings, such as 150 or 250, may be desirable for one or more reasons. The wings, for example, extend the width of the cable, which can be undesirable in some applications. Additionally, the wings are frequently made of a polymer and adhesive, both of which may be flammable, particularly if polyester is used. Moreover, the wings may represent a weak spot in the covering of the cable cores where delamination might occur. Delamination is undesirable because it allows the cores inside the cable to be exposed to moisture or other environmental elements, which might degrade their performance or cause a premature failure of the cable. Alternatively or additionally, delamination may lead to loss of mechanical integrity of the cable, which can create problems within an electronic system as the cable cores may not be constrained in an intended location.

FIGS. 3A and 3B illustrate an alternative cable construction method that avoids wings such as 150 and 250. In this example, the construction technique is illustrated for a cable 300 having the same configuration as cable 200 (FIG. 2).

Cable 300 is similarly made by aligning cores 304a, 304b, 304c and 304d so as to form a bundle with a first side 320a and a second side 320b and edges 322a and 322b. Here, cable cores 304a and 304b are designed to carry high speed signals, and are made in a conventional twinax configuration with a shielding tape 310 wrapped around pairs of insulated conductors. The shielding tape has a metal layer, 310a, acting as a shield, and an outer insulative layer 310b. The wrap may be a spiral wrap or a longitudinal wrap, such as is described in U.S. Pat. No. 7,790,981, which is hereby incorporated by reference in its entirety. In some embodiments, there may be one or more additional layers in the wrap, such as an additional PET layer holding the shielding wrap in place.

Cable cores 304c and 304d are here designed for low speed control signals and consist of single insulated conductors. The cable cores may be secured in the bundle by securing them to a flexible sheet 308. In the illustrated embodiment, a single unitary flexible sheet 308 is used.

As illustrated in FIG. 3A, flexible sheet 308 is applied by first positioning it adjacent first side 320a. A folding tool (not shown in FIG. 3A) is used to fold flexible sheet 308 around edges 322a and 322b. Flexible sheet 308 is sized such that opposite edges 332a and 332b overlap in region 330 (FIG. 3B). Region 330 may be between 0.2 and 10 mm wide.

In some embodiments, the region of overlap may be set as a percentage of the width of the cable. FIG. 6 shows an example in which there are 17 cores, aligned side-by-side such that there is a cable width W. In this example, W may be for example, between 30 and 40 mm, such as 37.52 mm in this example. In such an embodiment, the region of overlap 630 may be between 20% and 40% of W, or between 20% and 30% in some examples, such as 25%, which may be 9.38 mm in the illustrated example. In yet other embodiments, the region of overlap may be set as a percentage of the surfaces distance of the cores adjacent the second side. In the example of FIG. 6, each of the cores has a surface width D adjacent the second side 620b. In the example of FIG. 6, there are 17 cores such that the total surface width of the cores is 17*D. The region of overlap 630 may be between 20% and 40% of the total surface width, or between 20% and 30% in some examples, such as 25% of the total surface width. In embodiments in which the which each core has a surface width of for example, about 1.1 mm, region 630 may be between 4 and 5 mm, for example.

It should be appreciated that, though flexible sheet 308 encircles the cable cores, it is not a requirement that the cores be fully encircled with no gaps. It is not a requirement that the edges 332a and 332b (FIG. 3A) overlap. In some embodiments, for example, edges 332a and 332b may but against each other or be secured to the same core with a separation less than the surface width of that core.

In some embodiments, region 330 may be approximately equal to (such as within +/−20%) or greater than the pitch between cable cores, such as 2.21 mm in a specific example. Such a configuration may ensure the region 330 extends fully across an upper surface of a cable core. Accordingly, region 330 may be adjacent second side 320b. FIG. 3B illustrates region 330 centered on second side 320b. However, region 330 may be positioned in any suitable location around the perimeter of the cable.

Edges 322a and 322b may be adhered in any suitable way. In some embodiments, an inner surface facing cable cores 304a . . . 304d may be coated with an adhesive layer. A suitable adhesive may be EAA, for example. A suitable adhesive thickness may be between 10 microns and 25 microns, in some embodiments. Following a folding operation in which edges 322a and 322b are overlapped, the cable may be pressed between rollers (not shown). In embodiments in which the adhesive is heat activated, the rollers may be heated so as to activate the adhesive when edges 322a and 322b are pressed together. In some embodiments, edges 322a and 322b may be adhered by fusing them together, such as by applying heat. Such an approach may be appropriate when PVC or other thermoplastic material is used for flexible sheet 308. An operation that adheres edges 322a and 322b may also adhere flexible sheet 308 to outer surfaces of the cable cores. In the embodiment illustrated, flexible sheet 308 is adhered to all of the cable cores on sides 320a and 320b as well as on edges 322a and 322b as a result of an adhesive layer on sheet 308. However, it is not a requirement that the sheet 308 be adhered to all of the cores or that the same method of adhering be used in all places. Different adhesives may be applied in different locations based on the types of materials to be adhered.

To press the sheet 308 against the cable cores, hard rollers, as illustrated in FIG. 1 may be used. In that case the rollers may have grooves that collectively implement a cross section as shown in FIG. 3B. Alternatively, the rollers may be soft, such as may be formed with foamed rubber, yielding to conform to the contours of the cable in cross section. In either case, the sheet 308 may be adhered to surfaces of the cores, and may be suspended between the cores.

In accordance with some embodiments, flexible sheet 308 may be a sheet of insulative material, such as PET (polyethylene terephthalate), PFA (polyfluoroalkoxy), FEP (fluorinated ethylene propylene), PVC (polyvinyl chloride), or other insulating materials. For example, flexible sheet 308 may be polyester or may be a polyimide.

In other embodiments, the flexible sheet may be a laminate, comprising layers of two or more materials. In accordance with some embodiments, the laminate may comprise a metal foil adhered to an insulative film. In some embodiments, the metal foil may aluminum or copper and may have a thickness between 0.5 and one mil. The insulative film may have a thickness between 0.2 and 1.0 mil. In other embodiments, the insulative film may be 0.4 mil to 0.6 mil polyester film. In yet other embodiments, the insulative film may be 5 microns to 20 microns polyester film.

In some embodiments, a laminate including metal foil may take the place of shielding films such as 108a and 108b in a cable constructed as in FIG. 1. In contrast to cable 100, improved sealing of the edges of the cable may be provided. Additionally, wings 150 may be avoided, improving the flammability rating, such as by passing UL 94 qualification testing.

Similar benefits may be achieved using a wrapped laminate including a metal foil as flexible sheet 308 in a cable as in FIG. 3B. In that scenario, shielding of differential pairs or other cable cores designed to carry high-speed signals is provided by shielding tapes 310 wrapped around conductors of the core. The metal foil in flexible sheet 308, therefore, does not serve as a shield, It may be electrically insulated within the cable from the shields 310a provided by shielding tapes 310 of each core. Rather, the metal foil in the flexible sheet 308 may modify the mechanical properties of cable 300. Specifically, it may provide bending/folding memory.

Bending/folding memory may refer to the ability of a cable to retain a folded position with very low relaxation. In some embodiments, the cable may maintain a bend angle, formed by folding the cable over itself, relaxing by no more than 5%, over a period of 1 hour. In other embodiments, the relaxation may be less over the same period of time such as between 1 and 5% or in other embodiments, the relaxation rate may be slightly more, such as between 5-8% or 8-10%. The initial bend angle, after a fold may be, for example 90 degrees or 180 degrees and the bend radius may be between 5 mm and 10 mm or, in some embodiments less, such as between 1 mm and 5 mm or in other embodiments, greater, such as between 10 mm and 20 mm.

In some embodiments, alternative techniques for incorporating a metal layer for improved bend or fold memory may be used. In some embodiments, for example, flexible sheet 308 may be an insulative layer, without a metal layer. A metal layer (not shown), such as a metal foil as described above, may be wrapped around the cable separate from a flexible sheet 308. The metal layer may similarly have an overlapping region, such as region 330, formed by adhering one edge of the foil to the other. The region of overlap of the foil edges may be offset from the region of overlap of the insulative layer. An adhesive, including any of the adhesives as described herein, may be applied to adhere the foil to other elements of the cable. The foil may be adhered inside an insulative flexible sheet 308, in which case the adhesive may secure the metal foil to outer surfaces of cable cores 304a . . . 304d. Alternatively, the foil may be adhered outside insulative flexible sheet 308, in which case the adhesive may secure the metal foil to an outer surface of insulative flexible sheet 308. In embodiments in which a metal foil is secured outside of flexible insulative sheet 308, a further layer of insulation (this is not shown) may be applied over the metal foil. Any of the materials described herein for an insulative layer may be used, and the outer insulation layer may be the same material as an insulative flexible sheet 308. However, in some embodiments the outer insulative layer may be a different material than the inner insulative layer. For example, the outer insulative layer may have a higher flame resistance rating than the inner insulative layer.

In some embodiments, the outer layer of insulation may be applied by wrapping and securing overlapping edges in the same way as described above in connection with insulative layer 308. In other embodiments, the outer layer of insulation and a metal foil may be applied in one operation by wrapping laminate, including the layer of insulation and the metal foil, as described above.

FIG. 4 illustrates an alternative technique for incorporating one or more layers of metal foil to improve bending or folding memory. In the example of FIG. 4, cable 400 includes cable cores 404a, 404b, 404c and 404d, which are configured similarly to the cable cores 304a, 304h, 304c and 304d in FIG. 3A. In this example, however, a layer of metal 450 is applied over and secured to the cable cores, such as with an adhesive layer. Rather than wrapping a layer of metal, as described above, FIG. 4 illustrates a layer of metal 450 applied on only one side of the cable cores. In other embodiments, separate layers of metal may be applied to both sides of the cable. Either or both layers of metal may be electrically insulated from the metal 410a of the shielding tape, at least by insulative layers 410b. Where multiple layers of metal are used, they may be electrically insulated from each other within the cable.

After the one or more metal layers are applied, the flexible sheet 408 may be applied, as above, with overlapping edges 432a and 432b. Flexible sheet 408 may be a single layer or may be a laminate, with multiple layers, using any of the materials as described above or any other suitable materials.

FIG. 5 is a flowchart of an illustrative method 500 of manufacturing a cable according to techniques described herein. The method begins at block 508 where conductors to be used in the cable cores are obtained. In some embodiments, the conductors may be single or multi-stranded wires that are each insulated. In such an embodiment, the conductors may be obtained by extruding insulation around the wires.

At block 510, cable cores are prepared. In embodiments in which the cable being produced are shielded, such as in a twinax cable, preparing the cores involves wrapping shielding tape around insulated conductors. Wrapping may include wrapping spirally or longitudinally. In embodiments in which other types of cores are used, processing at block 510 may include preparing cores in other ways.

Method 500 continues to block 512. At block 512, the cores may be aligned with a spacing matching the desired spacing in the finished cable. Known cable processing equipment may be used for this purpose.

At block 514 an optional step of applying a metal foil may be performed. Processing at block 514 may entail laying a metal foil adjacent one side of the aligned cores, such as is illustrated by the positioning of the layer 450 adjacent to the cable cores in FIG. 4. However, a metal foil may be applied in other ways, such as wrapping the metal foil or wrapping a metal/insulator laminate around the cable cores. Moreover, optional block 514 may be performed at any suitable point in the process. For example, though FIG. 5 illustrates block 514 occurring after the processing in block 512, a metal foil may be added to the structure at other points, such as after block 518 or after block 520.

In the embodiment of FIG. 5, after block 512, or after block 514 is performed, processing proceeds to block 516. At block 516 an insulator film is aligned in parallel with the cores, such as is pictured in FIG. 3A. The film may be aligned adjacent one side of the cores, such as side 320a (FIG. 3B)

At block 518, the insulator film is folded around the cable cores such that the edges of the insulator film overlap. A folding machine as known in the art may be used for this purpose.

At block 520, edges of the insulator film are sealed to each other. Additionally, the insulator films may be sealed to underlying structures. In embodiments in which a metal foil is between the cable cores and the insulator film, the insulator film may be adhered to the metal foil. In other embodiments, the insulator film may be adhered to surfaces of the cable cores. Such adhering may be performed using heated rollers or other suitable techniques.

The cable may thereafter be cut to length, terminated with connector to form a cable assembly or otherwise used in an electronic system.

FIG. 6 is a cross section of an alternative cable configuration. As shown, the cable cores are closely spaced. The percentage of the width, W, represented by space between cores may be less than 25%, and in some embodiments, the percentage may be less than 15% or less than 10%, or less than 5%. Such a cable desirably may be very dense. Flexible sheet 608 may nonetheless be adhered to the cores to securely hold them in place. In the embodiment illustrated, there are non-conforming regions 650, where flexible sheet 608 is not adhered to surfaces of the cores. The non-conforming regions may be a percentage of the regions in which flexible sheet 608 is adhered to the cable cores. That percentage may be, for example, less than 40% and in some embodiments, less than 30%, 25% or 20%, in yet other embodiments.

Having thus described several aspects of at least one embodiment of this invention, it is to be appreciated that various alterations, modifications, and improvements will readily occur to those skilled in the art.

For example, it was described above that the inner surface of flexible sheet 308 is coated with a heat activated adhesive, such as a heat sealable copolymer. Alternatively, inner and outer surfaces of flexible sheet 308 may be provided with different parts of a contact adhesive such that pressing edges 332*a* and 332*b* together brings to parts of the adhesive together, causing them to adhere.

Further, though the cable construction techniques described herein may be used with cables of many thicknesses, they are particularly suitable for making thin cables. For example, cables as described herein may have a thickness of 1.5 mm or less. In some embodiments, the cables may have a thickness of 1 mm or less.

As an example of a further variation, FIG. 31 illustrates shields 310*a* inside of insulative layer 310*b*. In some embodiments, shields 310*a* may be wrapped outside of insulative layer 310*b*, In such an embodiment, drains, such as 312 (FIG. 3B) may be outside the wrapping so as to contact shields 310*a*. In such a configuration, an overwrap of insulative material may be applied to each core. An overwrap may be used, for example, if the inner layer of flexible sheet 308 is conductive. Alternatively, the outwardly facing shields of the cores may be insulated insulative layers in flexible sheet 308. Flexible sheet 308 may have either inward or outwardly facing surfaces, or both, may be insulative, and may prevent conducting structures within the cable from unintentionally contacting conducting structures outside the cable.

Further, it should be appreciated that other variations may be made in the number or position of the drains. For example, though two drains to the side of each core are shown in some embodiments, the two drains may be positioned above and below the wires of the core, such as in gaps between the insulators. Moreover, some embodiments may have only one drain wire per core, which may be positioned in any of the locations discussed above. Further, some embodiments may have fewer than one drain wire per core. In some embodiments, for example, there may be a single drain wire or a small number of drain wires, such as two or three per cable. In some embodiments, there may be no drain wires, such as in embodiments in which the shields 310*a* are on the outside of the core, in which case a cable connector or other termination may be attached to the foils rather than two the drains.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of" will refer to the inclusion of exactly one element of a number or list of elements. In general, the term "or" as used herein shall only be interpreted as indicating exclusive alternatives "one or the other but not both") when preceded by terms of exclusivity, such as "either," "one of," "only one of," or "exactly one of" "Consisting essentially of," when used in the claims, shall have its ordinary meaning as used in the field of patent law.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A ribbon cable comprising:
    a plurality of cores, wherein each core comprises at least one conductor and shielding material, and the plurality of cores are aligned in parallel, so as to define a first side and a second side and a first edge and a second edge;
    a wrap comprising a unitary insulative sheet encircling the plurality of cores, wherein:
        the unitary insulative sheet conforms to outer surfaces of the plurality of cores at the first side and at the first edge and the second edge and at least a portion of the second side.

2. The ribbon cable of claim 1, wherein the unitary insulative sheet comprises a polyester film.

3. The ribbon cable of claim 2, wherein the polyester film has a thickness between 5 microns and 20 microns.

4. The ribbon cable of claim 3, further comprising an adhesive layer applied to the polyester film, wherein the adhesive layer has thickness between 10 microns and 25 microns.

5. The ribbon cable of claim 1, wherein the unitary insulative sheet comprises a first portion and a second portion, overlapping and sealed to the first portion.

6. The ribbon cable of claim 1, wherein the unitary insulative sheet comprises a metal layer.

7. The ribbon cable of claim 6, wherein the unitary insulative sheet further comprises a polyester film.

8. The ribbon cable of claim 7, wherein the shielding material is wrapped around the at least one conductor of a core of the plurality of cores so as to provide a plurality of shields.

9. The ribbon cable of claim 8, wherein the metal layer is electrically insulated within the cable from the plurality of shields.

10. The ribbon cable of claim 8, wherein each of the plurality of shields comprises a laminate comprising an insulating film and a metal foil bonded thereto.

11. The ribbon cable of claim 10, wherein, for each of the plurality of shields, the laminate is longitudinally wrapped around the at least one conductor of a respective core of the plurality of cable cores.

12. The ribbon cable of claim 10, wherein, for each of the plurality of shields, the laminate is spirally wrapped around the at least one conductor of a respective core of the plurality of cable cores.

13. The method of claim 12, wherein adhering comprises heat sealing.

14. The ribbon cable of claim 2, wherein:
    the polyester film has a thickness between 5 microns and 20 microns; and
    the ribbon cable further comprises an adhesive layer applied to the polyester film.

15. The ribbon cable of claim 1, wherein the unitary insulative sheet comprises a first edge and a second edge opposite the first edge, wherein both the first and second edges of the unitary insulative sheet are adjacent the second side, wherein the first edge and the second edge are separated from one another by a gap such that a region of the second side is not covered by the unitary insulative sheet.

16. A method of manufacturing a ribbon cable, the method comprising:
    aligning a plurality of shielded cable cores in parallel so as to define a first side and a second side;
    positioning a unitary flexible sheet adjacent the first side;
    folding a first edge and a second edge of the unitary flexible sheet over the plurality of cable cores such that the first edge and the second edge are adjacent the second side; and
    adhering the unitary flexible sheet to outer surfaces of the plurality of cable cores.

17. The method of claim 16, wherein adhering the overlapping portions of the first edge and second edge further comprises adhering the unitary flexible sheet to surfaces of the plurality of cable cores.

18. The method of claim 16, wherein the plurality of cable cores comprises twinax cable cores and the plurality of shielded cable cores are aligned with single conductor cores.

19. The method of claim 16, further comprising, prior to the folding the first edge and the second edge, positioning a layer of metal adjacent the second side.

20. A ribbon cable comprising:
    a plurality of cores, wherein each core comprises at least one conductor wrapped with a shield, and the plurality of cores are aligned in parallel, so as to define a first side and a second side;
    a wrap comprising a unitary insulative sheet encircling the plurality of cores, wherein:
        the unitary insulative sheet comprises a polyester film and a metal layer;
        the unitary insulative sheet conforms to outer surfaces of the plurality of cores at the first side and the second side; and
        the unitary insulative sheet comprises a first portion and a second portion, overlapping and sealed to the first portion.

* * * * *